(12) United States Patent
Polischuk et al.

(10) Patent No.: US 6,353,229 B1
(45) Date of Patent: Mar. 5, 2002

(54) DIRECT CONVERSION DIGITAL X-RAY DETECTOR WITH INHERENT HIGH VOLTAGE PROTECTION FOR STATIC AND DYNAMIC IMAGING

(75) Inventors: Bradley Trent Polischuk, Pierrefonds; Philippe Leblanc, St-Luc; Martin Choquette, Laval; Ziad Aziz Shukri, Verdun; Henri M. Rougeot, Beaconsfield, all of (CA)

(73) Assignee: FTNI Inc., Montreal (CA)

( * ) Notice: Subject to any disclaimer, the term of this patent is extended or adjusted under 35 U.S.C. 154(b) by 0 days.

(21) Appl. No.: 09/342,256

(22) Filed: Jun. 29, 1999

(30) Foreign Application Priority Data

Jul. 8, 1998 (CA) .............................................. 2242743

(51) Int. Cl.[7] .............................................. G01T 1/24
(52) U.S. Cl. .............................. 250/370.14; 250/370.09
(58) Field of Search ........................ 250/370.14, 370.09

(56) References Cited

U.S. PATENT DOCUMENTS

| | | | |
|---|---|---|---|
| 5,198,673 A | 3/1993 | Rougeot et al. | 250/370.11 |
| 5,396,072 A | 3/1995 | Schiebel et al. | 250/370.09 |
| 5,436,101 A | 7/1995 | Fender et al. | 430/65 |
| 5,528,043 A | 6/1996 | Spivey et al. | 250/370.09 |
| 5,598,004 A | 1/1997 | Powell et al. | 250/370.09 |
| 5,693,947 A * | 12/1997 | Morton | 250/370.09 |
| 5,892,222 A * | 4/1999 | Elabd | 250/226 |

FOREIGN PATENT DOCUMENTS

| | | |
|---|---|---|
| EP | 0826983 | 3/1998 |
| WO | WO9622616 | 7/1996 |

OTHER PUBLICATIONS

Encyclopedia of Electronics, First Edition (S. Gilbilsco, Editor–in–Chief), 1985, TAB Book, Inc., p. 618.*
Zhao Wei et al.; "Digital Radiology Using Active Matrix Readout of Amorphous Seleni Detectors With High Voltage Protection"; Jan. 27, 1998; Med Phys 25(4), pp. 539–549.
Lee D. et al.; "A New Digital Detector For Projection Radiology"; Feb. 26–27, 1995; SPIE vol. 2432, pp. 237–249; San Diego, CA.

* cited by examiner

*Primary Examiner*—Constantine Hannaher
*Assistant Examiner*—Shun Lee
(74) *Attorney, Agent, or Firm*—George J. Primak

(57) ABSTRACT

A direct conversion digital x-ray detector is provided with inherent high voltage protection for static and dynamic imaging. The detector has an n-channel active matrix TFT array, a coplanar photoconductor structure and a high voltage biasing electrode. In order to achieve high voltage protection, the biasing electrode is set to a negative potential and the TFT "off" gate voltage is set to a predetermined negative value, such that the TFT is essentially nonconductive.

25 Claims, 8 Drawing Sheets

Image Saturation Mode

DIRECT CONVERSION DIGITAL X-RAY DETECTOR WITH INHERENT HIGH VOLTAGE PROTECTION FOR STATIC AND DYNAMIC IMAGING

BACKGROUND OF THE INVENTION

1. Field of the Invention

This invention relates to the acquisition of a radiographic image using a large area, direct conversion, solid state detector. More specifically, the present invention concerns an electronic solid-state image capture device for static and dynamic x-ray imaging applications. In particular, it relates to devices using a direct converter material, such as amorphous selenium, a flat panel TFT array, and solid-state charge amplifiers, such that the mode of operation prevents excessive voltage built-up across the TFT array that would be damaging to the TFT transistors.

2. Description of the Prior Art

A number of attempts have been made in the past to minimize high voltage effect or to achieve high voltage protection in image capture devices using a thin film transistor (TFT) array.

For example, in the paper by Zhao Wei, Law James, Waechter D., Huang, Z., and Rowlands J., entitled "Digital Radiology using active matrix readout of amorphous selenium detectors with high voltage protection", 1998, Med Phys 25 (4), pp. 539–549, a selenium-based x-ray imager with a special TFT dual-gate structure is disclosed which provides a high voltage protection. The dual gate structure provides the high voltage protection by forming a back channel in the TFT structure if the pixel voltage exceeds a certain potential, thus discharging the storage capacitor. Its main drawback comes from the fact that the saturation potential is controlled by deposition factors in the processing of the TFT array (i.e. ratio of oxide thickness of top and bottom gate insulators), and therefore cannot be externally controlled. The polarity of the bias voltage for the selenium layer in this example is positive high voltage.

In PCT International Application WO 96/22616 published Jul. 25, 1996, a TFT structure is described which minimizes the charge injection of the TFT switching for x-ray detectors. In this case, no mention is made about the high voltage protection, and the polarity used to bias the selenium layer is positive high voltage.

In U.S. Pat. No. 5,198,673 of Mar. 30, 1993 by Rougeot et al., a photosensitive selenium-based x-ray imager is described where the high voltage protection is provided by the presence of a second two-terminal protection device resident at each pixel location. This technique suffers from the fact that array construction is more complex, and that array yields may suffer as the pixel size is decreased since more and more circuitry must be placed on a smaller pixel size. Also, the saturation voltage of the pixel is determined by TFT array processing conditions, and therefore cannot be externally controlled.

In a paper by Lee D., Cheung L. K., and Jeromin L., entitled "A new digital detector for projection radiography", 1995, SPIE Vol. 2432, pp. 237–249, selenium-based TFT imaging system is disclosed where a thick dielectric layer is interposed between the high voltage bias electrode and the selenium layer. Thus, the high voltage protection mechanism comes from the fact that negative charges accumulate at the interface between the selenium layer and the insulator layer, thereby lowering the electric field and x-ray sensitivity of the selenium layer. However, this technique suffers from the fact that the negative charges must be eliminated prior to making a successive image, and hence this technique cannot be used for real-time imaging applications.

In U.S. Pat. No. 5,598,004 of Jan. 28, 1997 by Powell et al. and U.S. Pat. No. 5,396,072 of Mar. 7, 1995 by Schiebel et al. photoconductor-based imaging detectors are described, where one of the embodiments uses a selenium-based energy conversion layer. However, no mention is made of the high voltage protection of the TFT array.

In U.S. Pat. No. 5,528,043 of Jun. 18, 1996 by Spivey et al., a selenium-based system is described, where the active substrate uses a metal oxide semiconductor (MOS) circuit technology on silicon wafers, rather than TFT technology on glass substrates. In this technology, the design rules allow for a higher degree of integration, and therefore do allow to incorporate several transistors per pixel. This allows, for example, the use of a buffer to non-destructively read out a pixel, but does not mention whether high voltage protection of the circuit from the selenium bias is achieved.

In U.S. Pat. No. 5,436,101 of Jul. 25, 1995 by Fender et al., there is described a selenium structure which can be charged negatively by placing a blocking layer between the selenium and the substrate, but there is no mention of any high voltage protection of any element on the substrate.

Finally, in Canadian Patent Application No. 2,184,667 by Alain Jean and Bradley Trent Polischuk, published on Mar. 4, 1998, and corresponding European Application EP 0 826 983 also published on Mar. 4, 1998, a selenium multilayer structure is disclosed which, in addition to providing for real-time imaging capabilities, also leads to increased mechanical durability. However, no indication of how this structure could be used for high voltage protection is given.

OBJECTS AND SUMMARY OF THE INVENTION

It is an object of the present invention to overcome the various defects and limitations mentioned above by allowing a direct external control of the built-in voltage on the pixel capacitor.

A further object of the present invention is to achieve the desired high voltage protection by providing a photoconductor layer that can be biased negatively.

A still further object of the present invention is to fabricate a stack of layer forming a selenium p-i-n structure which allows negative bias at a very low dark current.

Other objects and advantages of the present invention will become apparent from the following description thereof.

In essence, the present invention comprises a direct conversion x-ray image electronic detector which has an n-channel active matrix thin film transistor (TFT) substrate, a coplanar selenium diode structure and a high voltage biasing electrode and in which high voltage protection is achieved by setting the high voltage biasing electrode to a negative potential and the TFT "off" gate voltage to a predetermined negative value, such that the TFT is essentially non-conductive. Such voltage is typically in the range of −1V and −20V and preferably about −10V. In this regard, there will always be some TFT leakage, however the negative "off" gate voltage may be adjusted so as to minimize the same and render the TFT essentially non-conductive.

The saturation exposure of the x-ray image electronic detector can be adjusted by changing the negative value given to the "off" gate voltage. Also, an external gain control may be obtained by changing the value of the negative high voltage on the biasing electrode which is typically between 1 kV and 30 kV.

The detector should also be provided with suitable charge amplifiers such as to sink the current coming from the TFT arrays.

In a preferred embodiment, the novel x-ray electronic detector uses a selenium p-i-n multilayer converter layer as a signal current source to avoid time delays in emptying and replenishing material charge traps. As is known, the p-i-n structure is a diode with the i layer sandwiched between the p and n layers.

BRIEF DESCRIPTION OF THE DRAWINGS

A preferred embodiment of the present invention will now be described with reference to the appended drawings in which.

DETAILED DESCRIPTION OF THE INVENTION

In the Figures, the same elements are identified by the same reference numbers.

Figure 1:
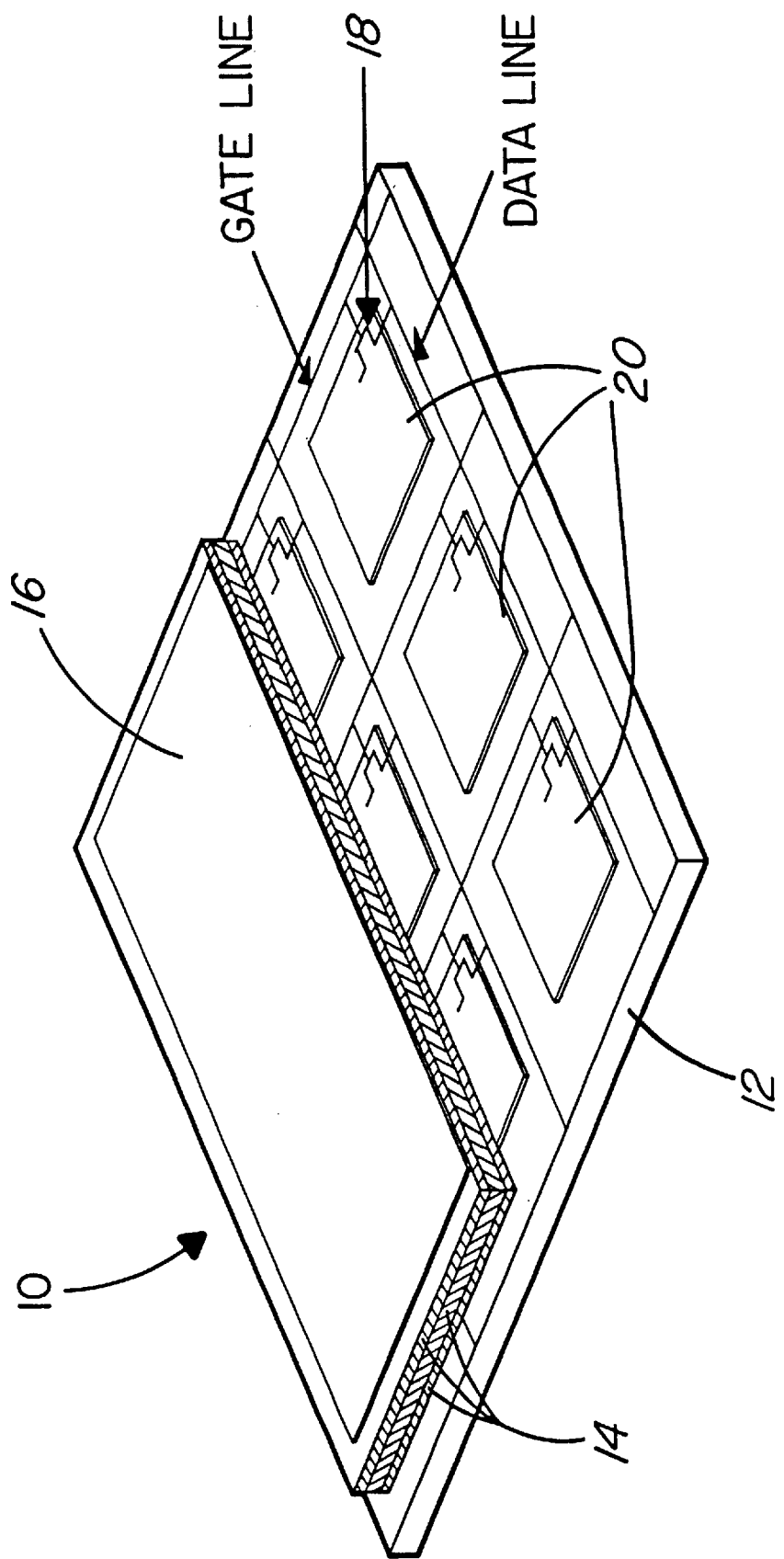
FIG. 1 is a perspective view of a structure of a detector in accordance with this invention.

FIG. 1 illustrates a preferred embodiment of the novel large area direct conversion digital solid state detector 10 for the acquisition of a radiographic image. It is comprised of an active matrix thin film transistor (TFT) substrate 12, a co-planar p-i-n selenium diode structure 14 and a high voltage (HV) biasing electrode 16. The TFT active matrix is further comprised of a two dimensional array of pixels 18 each of which can be individually addressed by the corresponding data and gate lines. Integrated into each pixel 18 is a collection electrode 20, a charge storage capacitor 22 (see FIG. 2), and a TFT metal-oxide-semiconductor-field effect transistor 24 (MOSFET) which serves as a switching device to gate the charge from the storage capacitor to the amplifier 26 located at the termination of the data line (see FIG. 2). The selenium p-i-n structure 14, whose function will be described later, is deposited directly on to the TFT active matrix 12. Finally, a large area conductive metal electrode 16 is deposited on top of the p-i-n structure 14 to serve as the high voltage biasing electrode 16 for the detector 10.

This detector 10 can be used to acquire an x-ray image as follows: The selenium p-i-n structure 14 has been designed and optimized such that it has a very high transversal resistance in the dark, as well as very high lateral resistance (see FIG. 4). Under dark conditions, the current that flows through the p-i-n diode is extremely small (~20 pA/cm$^2$) even when large bias voltages are applied to the device. When an x-ray photon impinges the detector 10, the photon is absorbed in the bulk of the selenium structure 14, and electron hole pairs are generated in the volume of selenium at the location where the x-ray photon was absorbed. The high voltage bias on the structure serves two purposes—first, it enhances the sensitivity of the selenium by preventing geminate recombination, and it also enables the carriers to reach their respective collection electrodes without trapping. The drift of these carriers in the selenium p-i-n structure 14 causes a displacement current to flow in the storage capacitor 22 immediately underneath the location of the selenium where the x-ray photon was absorbed. Consequently, in the absence of any leakage path, the voltage across the storage capacitor 22 at that particular location increases linearly proportionally to the current flowing into it. The final voltage that is attained on the storage capacitor 22 after the x-rays have terminated is thus proportional to the number of x-ray photons that were absorbed in the volume of selenium immediately above each collection electrode. Each storage capacitor 22 will attain a different final voltage, corresponding to the spatial representation of the x-ray fluence striking the detector 10 and hence represents the radiographic image of the patient.

Figure 2:
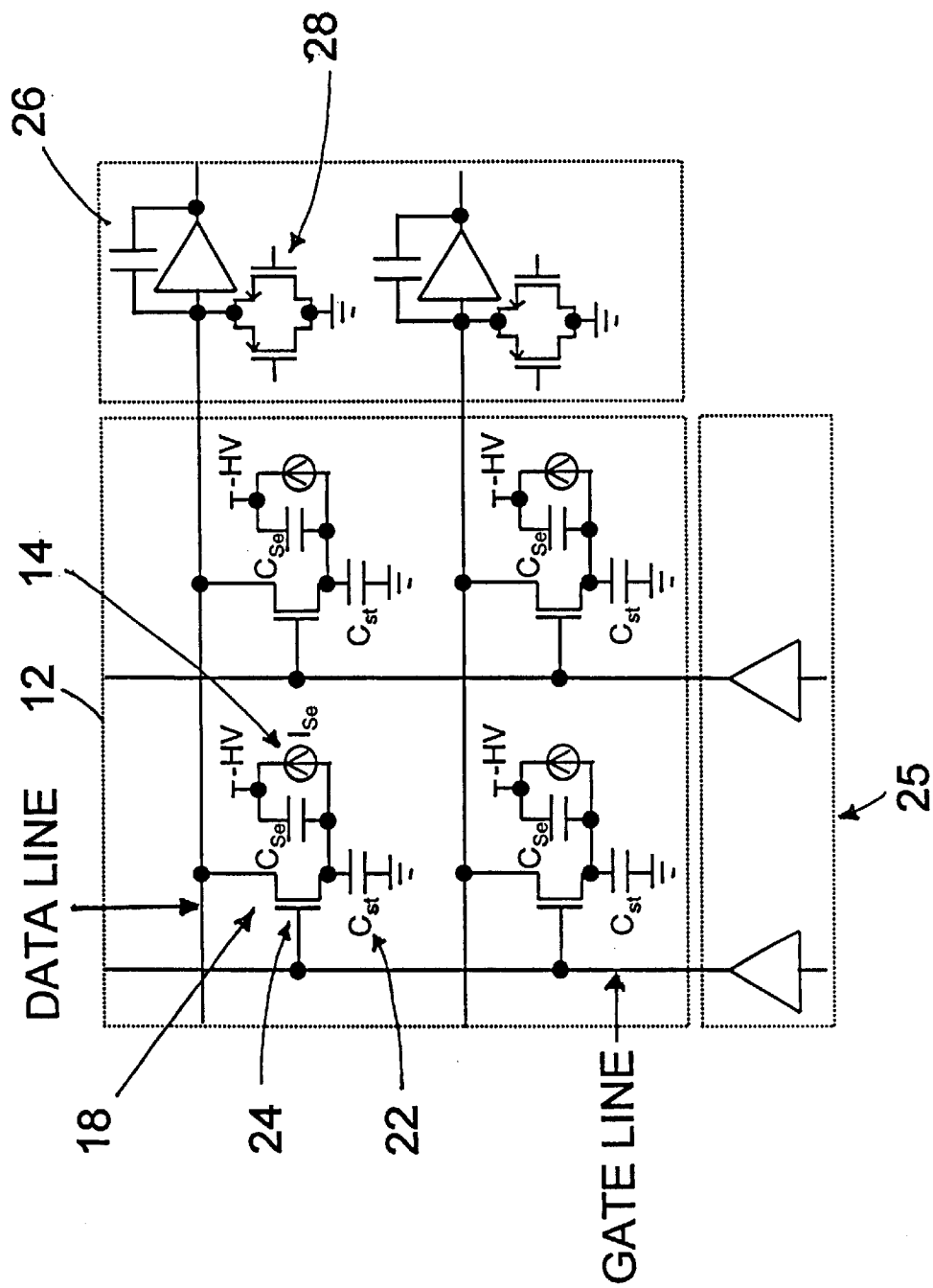
FIG. 2 diagrammatically illustrates a portion of a two dimensional TFT matrix where each pixel element contains a storage capacitor and a TFT transistor.

FIG. 2 further illustrates the two dimensional TFT active matrix 12 where each pixel element 18 contains a storage capacitor 22 and a TFT transistor 24, and the entire array is coated with a continuous selenium p-i-n structure 14 (which is represented in FIG. 2 as a current source in parallel with a selenium capacitance at each pixel location). Also shown in FIG. 2 are gate drivers 25 and read out amplifiers 26, which are either integrated directly onto the glass substrate, or attached to the glass by wire bonding, or other interconnect technology such as chip-on-glass, and the like. The image is read from the detector by turning on the TFT transistors 24 at each pixel location 18 in a multiplexed fashion by sequentially activating each gate line with the gate drivers 25 and allowing the charges on each storage electrode to flow through the pixel TFT channel, and along the data lines to a charge sensitive amplifier 26 located at the termination of each data line. The function of the charge amplifier 26 is to integrate the charge, and output a low noise buffered signal that is proportional to the amount of charge integrated during the readout. Each charge amplifier voltage is sampled by an analogue to digital (A/D) converter (not shown), and the corresponding digital values are stored in memory of a host computer (not shown) for subsequent image reconstruction, analysis, and display. Each charge amplifier 26 may be provided with an input protection device 28 to protect the charge amplifier 26 in exceptional circumstances when it may become overloaded.

As previously mentioned, the high voltage is required for making the selenium sensitive to x-rays, and this voltage is such as to produce electric fields between about 2V/$\mu$m and 70V/$\mu$m in the selenium structure. As already mentioned previously, this voltage is typically between 1 kV and 30 kV. If the leakage of the selenium structure is too great, or if a large x-ray exposure substantially lowers the resistivity of the p-i-n structure 14, then an appreciable fraction of this high voltage bias will fall across the integrated storage capacitor 22 on each pixel element. Catastrophic breakdown of the dielectric in the storage capacitor 22, for example $SiO_2$ or SiN, may result if the voltage gets too high. Further, since the source of the TFT MOSFET 24 is also connected to the storage capacitor 22, (see FIG. 6a), a substantial voltage may develop between the source and drain of the MOSFET leading either to punch through in the gate dielectric or damage to the channel of the device itself. It is therefore extremely important to prevent the pixel voltage from building up beyond the critical voltage level to avoid damage to the array if it is subjected to a fault condition, such as a large x-ray over-exposure.

Thus, the present invention, relating to the protection of the TFT 12 from high voltage damage, uses two separate enabling elements in combination with one another—namely a suitably designed low dark current, negative-biased photoconductor structure for direct x-ray conversion, and a suitably designed n-channel TFT active matrix for charge storage and readout. The photoconductor converter may consist of CdTe, PbO, $HgI_2$, CdSe, or similar materials. In the preferred embodiment of the present invention, the x-ray converting photoconductive structure is composed of doped amorphous selenium.

Figure 3:
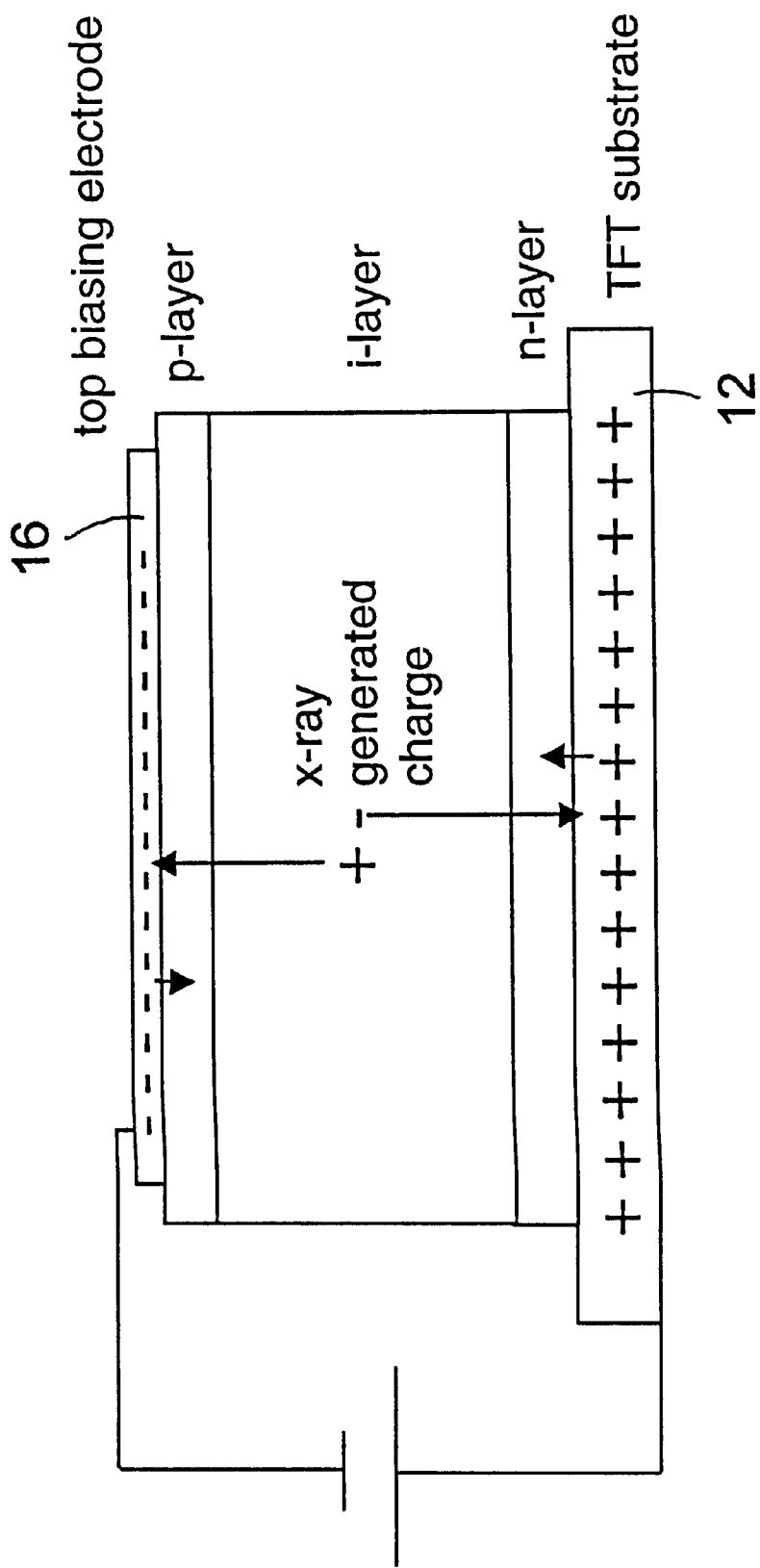
FIG. 3 represents a cross-section of the energy conversion layer, composed of three such layers designated as p-type, i-type and n-type, thus p-i-n.

FIG. 3 represents a cross section of the energy conversion layer, where it is indicated that there are essentially three such layers designated as p-type, i-type and n-type. The n-type and p-type layers function as one way charge valves, or blocking layers, to block the injection of charges from their respective electrodes into the selenium i-layer. The top blocking layer, called the p-layer, is named so because it is selectively doped so as to degrade the transport of electrons through it, while leaving the hole transport relatively unaffected. In this context, the layer is called p-type because any photoconductive drift current through this layer is composed only from the drift of holes. The bottom blocking layer, called the n-layer, is named so because it is selectively doped to degrade the transport of holes across its thickness, leaving the transport of electrons relatively unchanged. In this context, this layer is called n-type because any photoconductive signal through this layer is due to drift of electrons only. The middle layer in the structure, called the i-layer, is a doped amorphous selenium alloy which has been optimized in terms of maximizing both the electron and hole transport through the thickness of the i-layer. By sandwiching the appropriate blocking layer between the i-layer and the respective electrode, it is thus possible to substantially reduce the dark currents which flow through the photoconductor material, since the major contribution to the total dark current in these high resistive materials is charge injection from the electrode materials.

Figure 4:
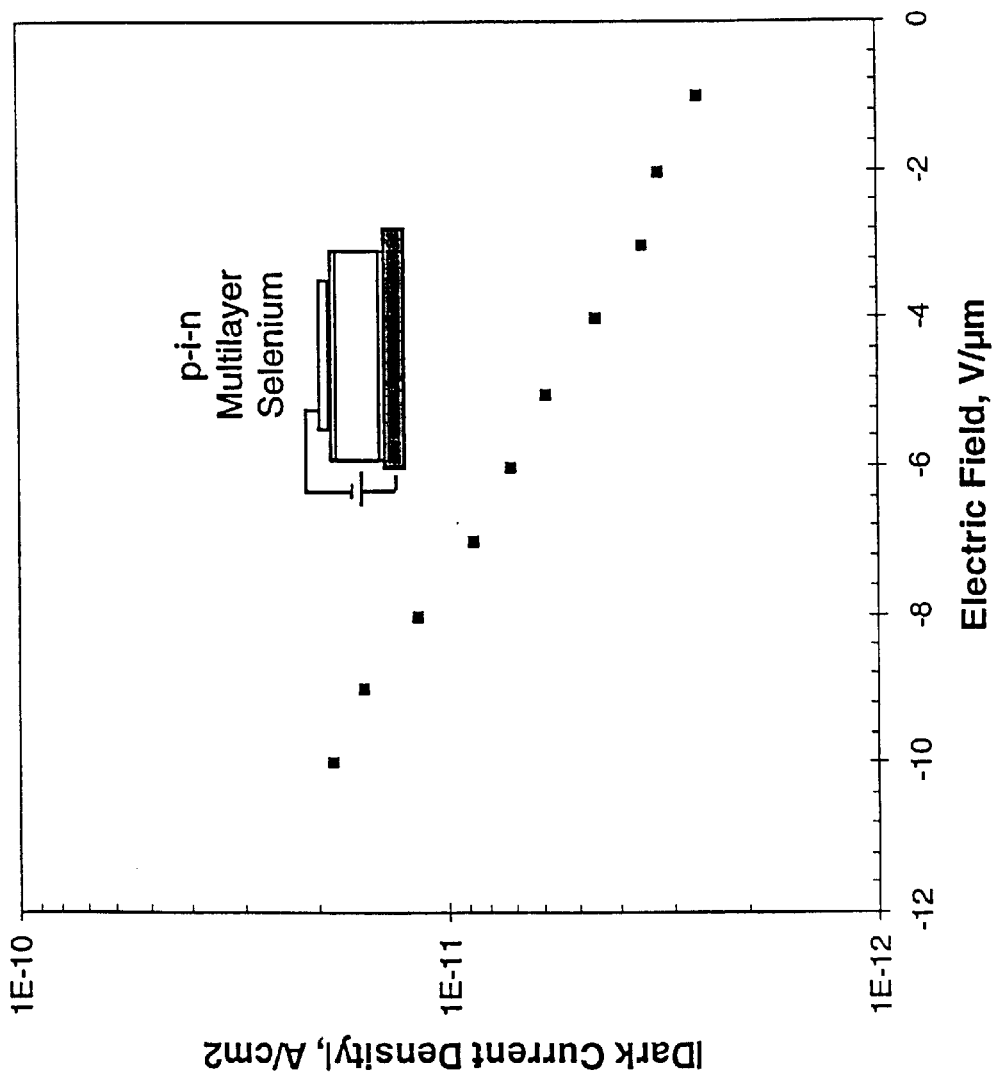
FIG. 4 shows a measured current versus electric field characteristic for a photoconductor structure which contains a p-i-n device.

FIG. 4 is a measured current versus voltage characteristic for a photoconductor structure which contains the n and p blocking layers (called the p-i-n device). In this and other figures, reference to "E" means "exponential". Thus 1E-6 means $10^{-6}$ and so on. The thick i-layer of the p-i-n device is composed herein of doped amorphous selenium that is 500 μm thick. The top electrode material in this case is Pd, although other technologically suitable materials such as Au, Al, Mo and Pt may be used. The bottom electrode material in this case is indium tin oxide (ITO) on glass, suitably chosen because of its widespread use in the LCD manufacturing process for the TFT active matrix arrays, although other materials such as Al may also be used. The measured current in FIG. 4 is almost 1000 times lower than the current which flows in a Schottky device that is biased under similar conditions. Schottky devices are known in the art. When such Schottky devices are biased negatively, the dark current which flows therein is prohibitively large, around 1 $\mu A/cm^2$ at a bias voltage of −5000V, to be used in this bias condition for an x-ray detector. In sharp contrast to this, the p-i-n device of the present invention biased under similar conditions has a dark current more than five orders of magnitude lower, and in this case around 20 $pA/cm^2$ which is more than adequate for practical use in an x-ray detector.

Figure 5:
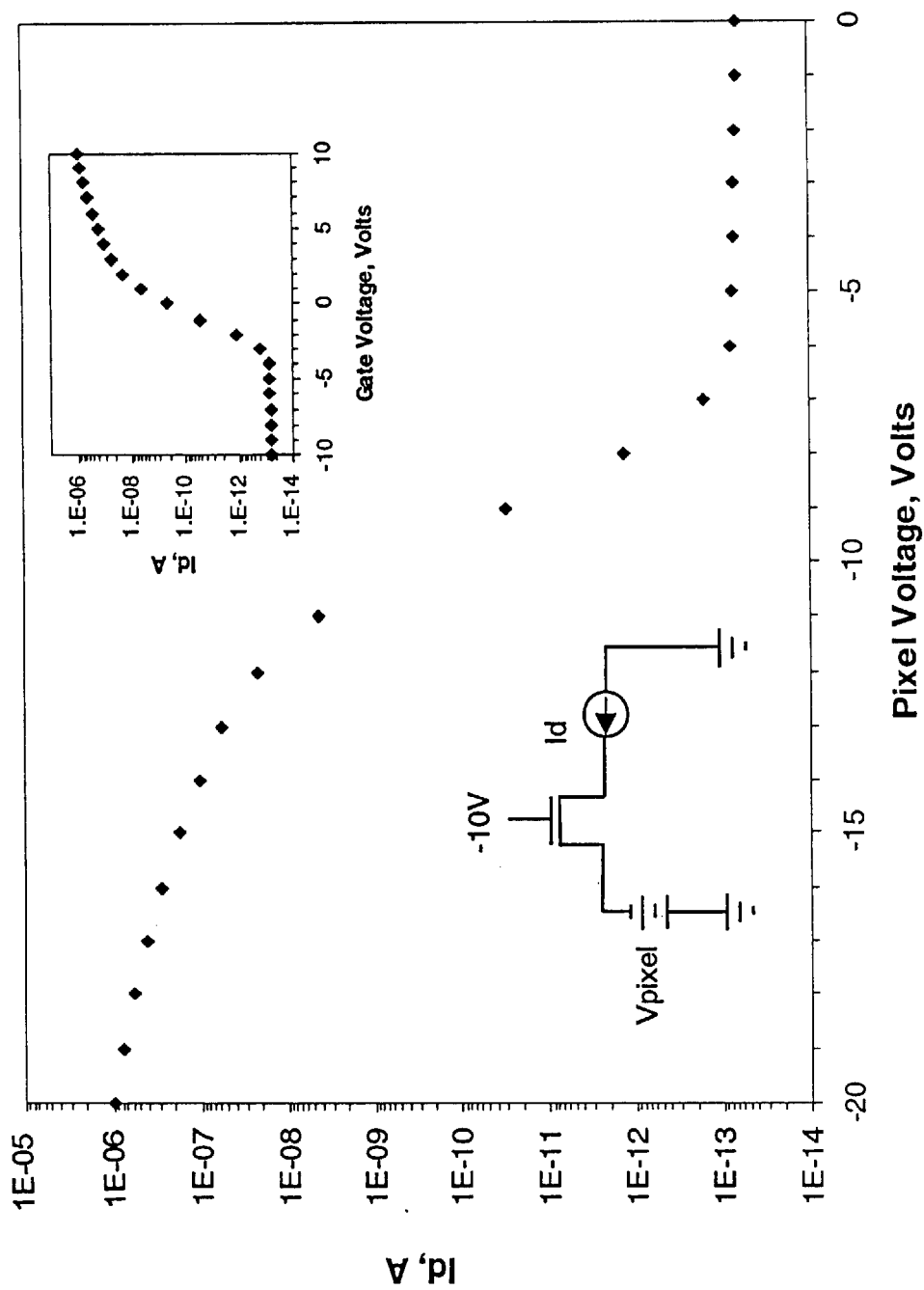
FIG. 5 shows the current flow through the channel of the TFT at various pixel voltages for a gate voltage of –10V, and the insert in this figure shows a measured drain current as a function of applied gate voltage.

The second enabling element of this invention is an n-channel TFT array, the typical characteristics of which are illustrated in FIG. 5. Typically, the TFT structure is formed by depositing a metal, which serves both as the gate of the TFT and one electrode of the storage capacitor, onto a glass substrate. To form the gate oxide and the dielectric of the storage capacitor, a thin layer of dielectric, for example SiN or $SiO_2$ is deposited. Following the dielectric material deposition and patterning, the semiconductor material, typically a-Si:H, p-Si or CdSe, is deposited onto the structure to serve as the channel of the TFT. To facilitate ohmic contacts to contact regions may be selectively doped n+ to lower any internal potential barrier. Source and drain metals are then deposited onto the structure to make electrical contact to the TFT. A thick passivation layer, typically several microns thick, is then deposited onto the structure prior to the deposition of the pixel electrode metal. This metal electrode makes contact to both the p-layer of the selenium coplanar p-i-n diode as well as the integrated storage capacitor. The pixel electrode material may extend over the top of the active TFT to improve the fill factor of the device. The inset of FIG. shows a measured drain current Id as a function of applied gate voltage for a typical a-Si:H TFT. Although the a-Si:H is a low mobility material, a reasonable device on current of about 1 μA and a very low off current <$10^{-13}$ A can be achieved by controlling the geometry of the transistor. If the TFT gate is held at a constant voltage of −10V, which is typically used to turn the TFT into their off state, and the pixel voltage is allowed to float negatively, it can be seen from FIG. 5 that the current Id which flows through the channel of the TFT remains relatively low for pixel voltages up to about −7V. In other words, the TFT remains in its high impedance state. However, as the pixel voltage decreases beyond −7V, the current through the channel of the TFT starts to increase dramatically, despite the fact that the TFT gate voltage is still maintained at its off potential.

Figure 6A:
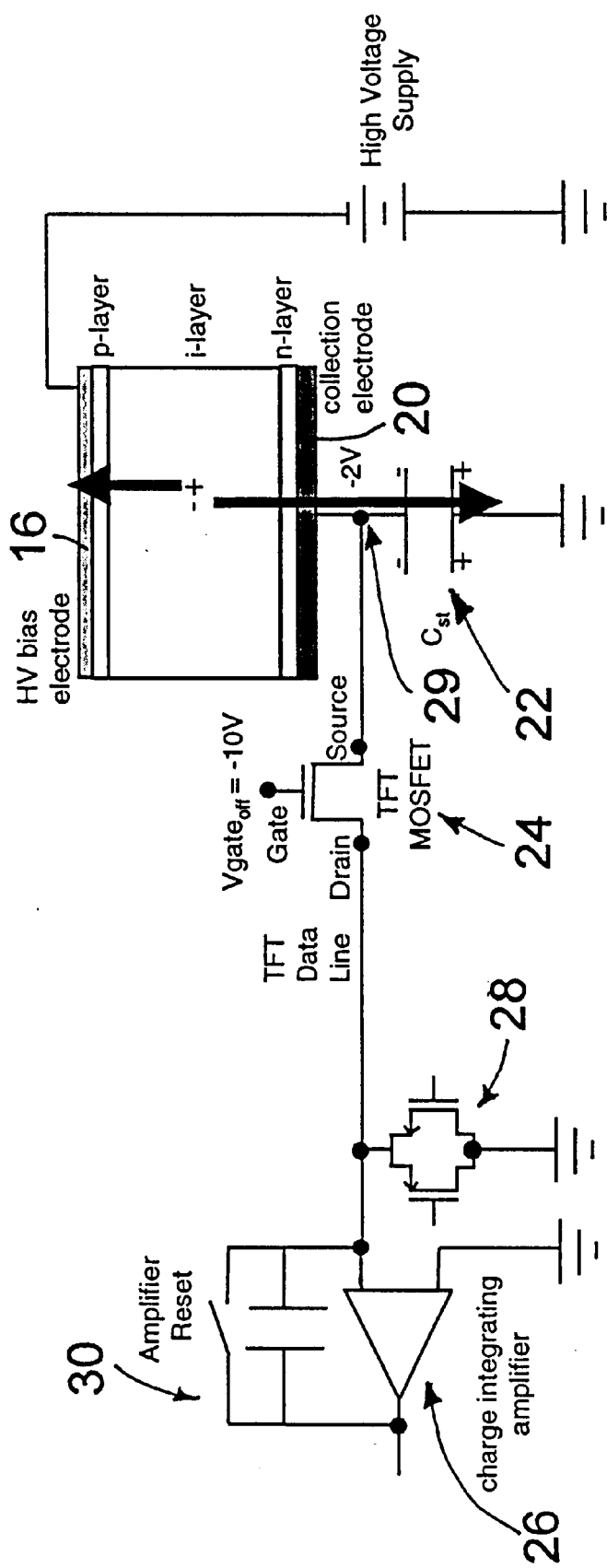
FIG. 6a and FIG. 6b are schematic representations of a single pixel collection electrode, a storage capacitor, TFT, integrating amplifier and selenium p-i-n structure in Image Acquisition Mode and Image Saturation Mode respectively.
Figure 6B:
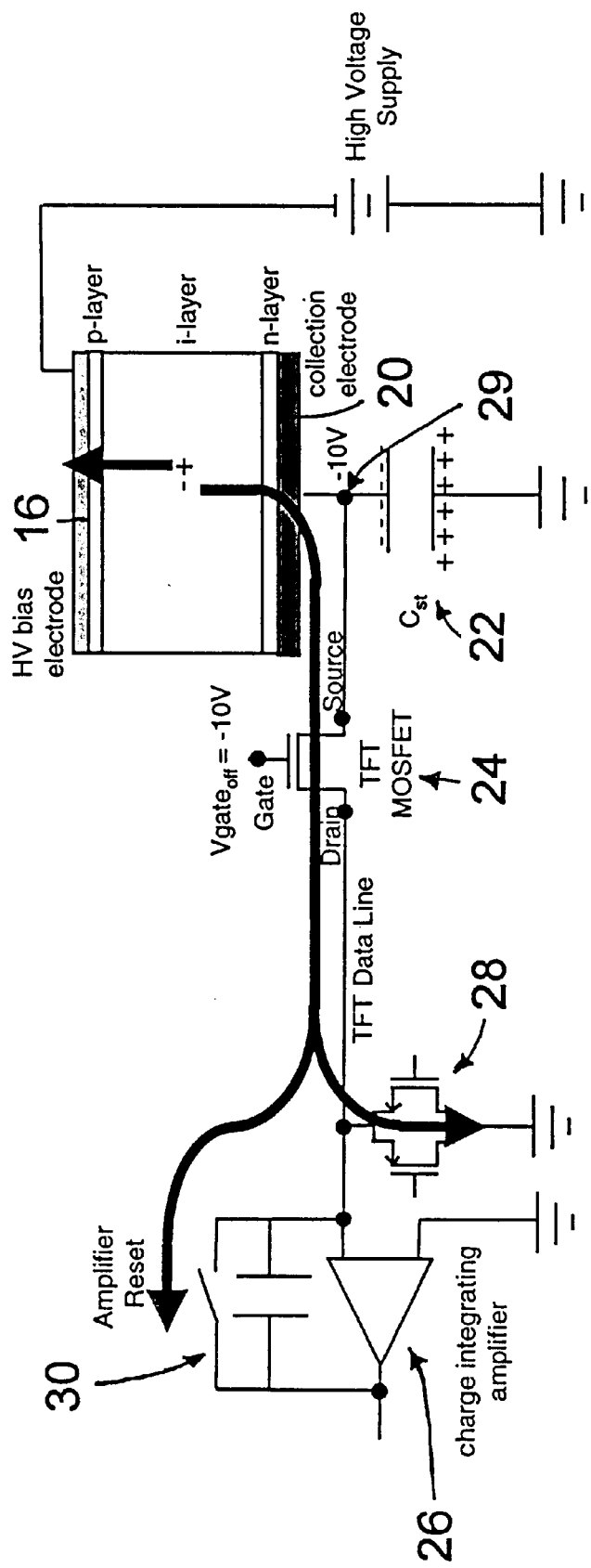

FIG. 6a and 6b schematically show a single pixel collection electrode 20, a storage capacitor 22, TFT MOSFET 24, integrating amplifier 26, and selenium p-i-n structure. During a normal image acquisition process shown in FIG. 6a, the voltage on the gate of the TFT is typically around −10V, which places the TFT in its off state (drain to source resistance around $10^{15}\Omega$) and forces all of the current generated in the selenium p-i-n layer by the x-rays to charge up the storage capacitor 22. This causes the floating node 29 to go from around zero volts to a negative voltage which, in this example, is indicated to be around −2V. After the x-rays have elapsed (static imaging) or at a repetitive frame rate (dynamic imaging), the gate voltage is turned from −10V to its "on" voltage, typically around +20 volts, to place the TFT in its "on" state (drain to source resistance around $10^6\Omega$). This allows the charge to flow from the storage capacitor through the TFT channel, to the charge integrating amplifier 26, thus providing a signal to be sampled by the A/D. It should be noted that this image readout process also resets the signal voltage on the storage capacitor to a preset reference voltage, such as zero volts, to allow for another image to be acquired.

If, however, during the image acquisition phase the current through the p-i-n structure is too high, then the voltage on the storage capacitor 22 would build up to a larger value, as indicated in FIG. 6(b). In the absence of any protection mechanism, the storage capacitor voltage can build up until device failure occurs, thus limiting the usefulness of the imaging detector for extreme imaging applications. This excessive current could be due to high x-ray overexposure, for example, or an electrical defect in the selenium layer. In this particular case, however, once the voltage on the capacitor exceeded −10V, then the gate-to-source voltage on the n-channel TFT MOSFET would become positive, thus lowering the channel resistance of the TFT. In other words, the TFT would turn on despite the fact that the gate voltage was still in its off state (i.e. −10V). The excess saturation charge then will flow through the TFT where it either gets neutralized by current flowing in the amplifier, or in extreme cases, dissipates to ground through specially designed input protection device 28 on the amplifier 26 to prevent damage to that particular channel of the amplifier 26. A simple reset sequence of the amplifiers by reset 30 prior to initiating the read sequence for the entire panel is required to flush the excess charges which accumulated on the feedback capacitance of the amplifiers on the lines where certain pixels saturated. This effect can be used to prevent the pixel storage capacitor on the TFT from building up to a damaging potential voltage during excessively large x-ray exposures.

Figure 7:
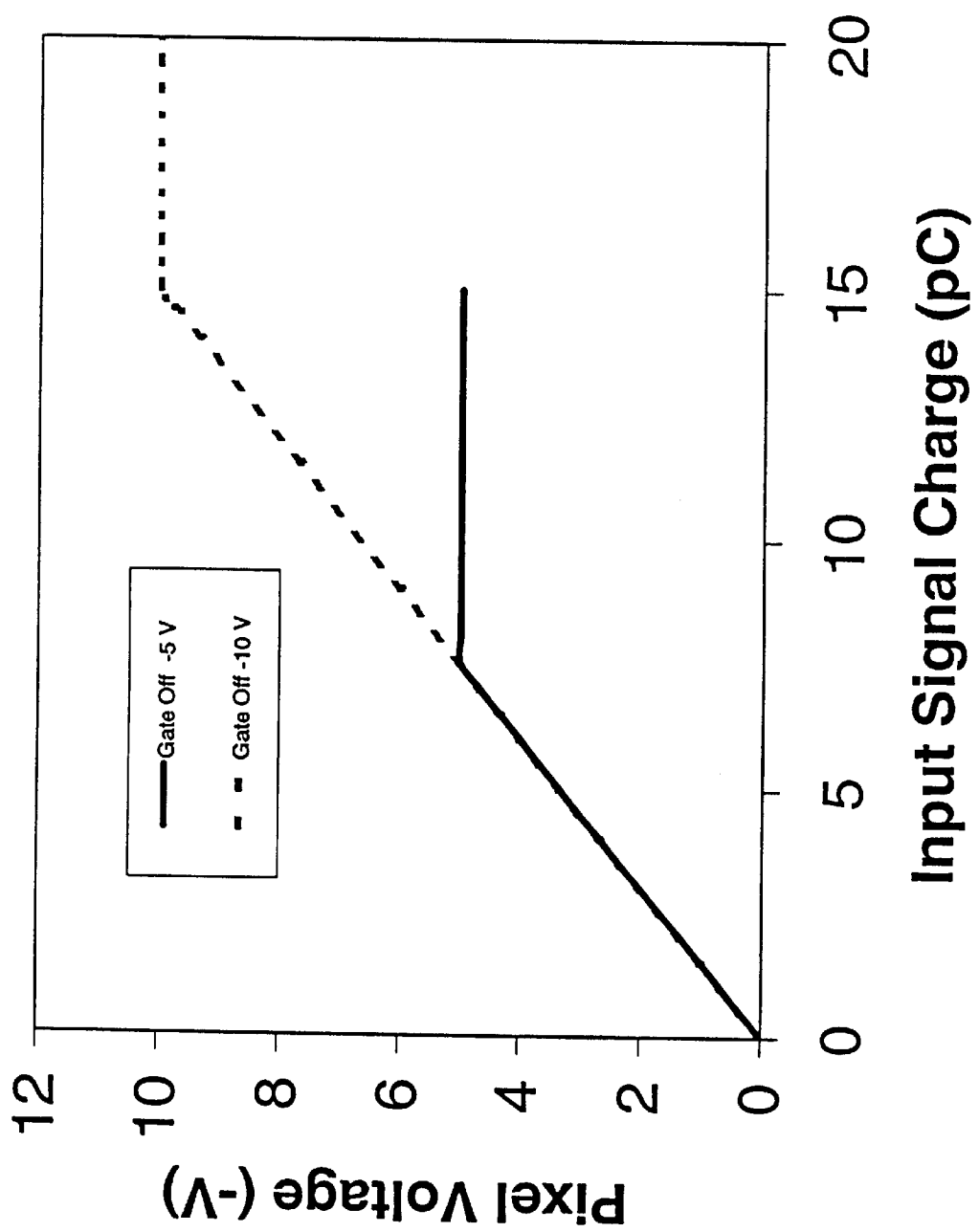
FIG. 7 is a graph of a measured pixel response as a function of input signal charge for gate off potentials of –5 V and –10 V.

FIG. 7 shows a measured pixel response as a function of input signal charge for gate off potentials of −5 V and −10 V. It can be seen that in either case, the pixel voltage increases linearly with increased signal charge for low levels. However, as the signal charge exceeds 7.5 pC and 15 pC (1 pico-Coulomb), the pixel voltages begin to saturate respectively at a value of about −5 V and −10 V, which is far lower than the critical voltage required to damage the TFT array. Moreover, increasing negative gate off voltages allows the pixel voltage to build up to higher potentials, thus increasing the dynamic range of the system. Therefore, the saturation voltage can be externally modified by adjusting the gate off voltage, which is significantly simpler than altering process steps during the fabrication of the TFT array as disclosed in some prior art references.

It should be understood that the invention is not limited to the specific embodiments described above, but that modifications obvious to those skilled in the art are also included therein. For example, reference to x-rays also includes gamma rays which are similarly used in medical and other applications. Also, in lieu of p-i-n diodes, which have been described herein by way of a preferred example, other photoconductors can be used within the scope of the present invention, such as TlBr, $PbI_2$, PbO, $HgI_2$, CdTe, CdZnTe and the like.

What is claimed is:

1. A direct conversion x-ray image electronic detector having an n-channel active matrix thin film transistor (TFT) substrate in which each TFT serves as a switching device, a coplanar photoconductor structure and a high voltage biasing electrode, wherein in order to achieve high voltage TFT protection, by means of the same TFT which serves as the switching device, the high voltage biasing electrode is set to a negative potential and the TFT "off" gate voltage is set to a predetermined negative value, such that the TFT is essentially non-conductive, but becomes conductive if voltage across the TFT exceeds the predetermined value.

2. An x-ray image electronic detector according to claim 1, in which the TFT active matrix is comprised of a two dimensional array of pixels, each of which can be individually addressed by corresponding data and gate lines.

3. An x-ray image electronic detector according to claim 2, in which into each pixel there is integrated a collection electrode, a charge storage capacitor and a TFT metal-oxide-semiconductor-field effect transistor (MOSFET) which serves as the switching device to gate the charge from the storage capacitor to a read out amplifier.

4. An x-ray image electronic detector according to claim 2, further comprising a charge amplifier located at termination of each data line and adapted to sink current coming from the TFT array of pixels.

5. An x-ray image electronic detector according to claim 4, further comprising an input protection device connected to each charge amplifier.

6. An x-ray image electronic detector according to claim 2, comprising means for controlling saturation exposure of the TFT pixels by the negative voltage value given to the "off" gate voltage.

7. An x-ray image electronic detector according to claim 1, in which the TFT "off" gate voltage is set at a value of between −1V and −20V.

8. An x-ray image electronic detector according to claim 7, in which the TFT "off" gate voltage is set at around −10V.

9. An x-ray image electronic detector according to claim 1, in which an external gain control is obtained by changing the high voltage negative potential value on the biasing electrode.

10. An x-ray image electronic detector according to claim 1, in which the photoconductor structure is a selenium p-i-n multilayer device having an i-layer of a doped amorphous selenium alloy sandwiched between p and n blocking layers.

11. An x-ray image electronic detector according to claim 10, in which the p-i-n device is deposited directly onto the TFT active matrix.

12. An x-ray image electronic detector according to claim 1, in which the photoconductor is made of TlBr, $PbI_2$, PbO, $HgI_2$, CdTe or CdZnTe.

13. A dynamic imaging apparatus incorporating an x-ray image electronic detector according to claim 1.

14. A direct conversion gamma ray image electronic detector having an n-channel active matrix thin film transistor (TFT) substrate in which each TFT serves as a switching device, a coplanar photoconductor structure and a high voltage biasing electrode, wherein in order to achieve high voltage TFT protection, by means of the same TFT which serves as the switching device, the high voltage biasing electrode is set to a negative potential and the TFT "off" gate voltage is set to a predetermined negative value, such that the TFT is essentially non-conductive, but becomes conductive if voltage across the TFT exceeds the predetermined value.

15. A gamma ray image electronic detector according to claim 14, in which the TFT active matrix is comprised of a two dimensional array of pixels, each of which can be individually addressed by corresponding data and gate lines.

16. A gamma ray image electronic detector according to claim 15, in which into each pixel there is integrated a collection electrode, a charge storage capacitor and a TFT metal-oxide-semiconductor-field effect transistor (MOSFET) which serves as the switching device to gate the charge from the storage capacitor to a read out amplifier.

17. A gamma ray image electronic detector according to claim 15, further comprising a charge amplifier located at termination of each data line and adapted sink current coming from the TFT array of pixels.

18. A gamma ray image electronic detector according to claim 17, further comprising an input protection device connected to each charge amplifier.

19. A gamma ray image electronic detector according to claim 15, comprising means for controlling saturation exposure of the TFT pixels by the negative voltage value given to the "off" gate voltage.

20. A gamma ray image electronic detector according to claim 14, in which the TFT "off" gate voltage is set at a value of between −1V and −20V.

21. A gamma ray image electronic detector according to claim 20, in which the TFT "off" gate voltage is set at around −10V.

22. A gamma ray image electronic detector according to claim 14, in which an external gain control is obtained by changing the high voltage negative potential value on the biasing electrode.

23. A gamma ray image electronic detector according to claim 14, in which the photoconductor structure is a selenium p-i-n multilayer device having an i-layer of a doped amorphous selenium alloy sandwiched between p and n blocking layers.

24. A gamma ray image electronic detector according to claim 23, in which the p-i-n device is deposited directly onto the TFT active matrix.

25. A gamma ray image electronic detector according to claim 14, in which the photoconductor is made of TlBr, $PbI_2$, PbO, $HgI_2$, CdTe or CdZnTe.

* * * * *